United States Patent
Sasaki (10) Patent No.: US 7,233,099 B2
(45) Date of Patent: Jun. 19, 2007

(54) MULTILAYER PIEZOELECTRIC ELEMENT (75) Inventor: Satoshi Sasaki, Akita (JP)

(73) Assignee: TDK Corporation, Tokyo (JP)

( * ) Notice: Subject to any disclaimer, the term of this patent is extended or adjusted under 35 U.S.C. 154(b) by 237 days.

(21) Appl. No.: 11/018,523

(22) Filed: Dec. 22, 2004

(65) Prior Publication Data
US 2005/0140251 A1 Jun. 30, 2005

(30) Foreign Application Priority Data
Dec. 25, 2003 (JP) ............... P2003-430912

(51) Int. Cl.
H01L 41/047 (2006.01)
B41J 2/045 (2006.01)
(52) U.S. Cl. ............... 310/365; 310/364; 310/366
(58) Field of Classification Search ......... 310/364–366
See application file for complete search history.

(56) References Cited

U.S. PATENT DOCUMENTS 6,369,487 B1 * 4/2002 Kameda et al. ............. 310/365

2004/0174094 A1 * 9/2004 Sasaki et al. ............... 310/328

FOREIGN PATENT DOCUMENTS

| JP | A 60-128682 | 7/1985 |
| JP | A 2000-261055 | 9/2000 |
| JP | A 2001-260349 | 9/2001 |
| JP | A 2002-254634 | 9/2002 |

* cited by examiner

Primary Examiner—Darren Schuberg
Assistant Examiner—J. San Martin
(74) Attorney, Agent, or Firm—Oliff & Berridge PLC (57) ABSTRACT A multilayer piezoelectric element includes first and second internal electrodes laminated alternately, and a piezoelectric layer disposed therebetween. The first internal electrodes are connected to each other, and the second internal electrodes are connected to each other, via through holes that penetrate the piezoelectric layer in the laminated direction. The first internal electrode is formed so that its periphery portion is exposed on the side face of the multilayer piezoelectric element. The second internal electrode is formed so that its periphery portion is positioned inside the side face.

18 Claims, 9 Drawing Sheets

MULTILAYER PIEZOELECTRIC ELEMENT

RELATED APPLICATION

Japanese Patent Application No. 2003-430,912 filed on Dec. 25, 2003, from which priority is claimed, is hereby incorporated herein by reference in its entirety.

BACKGROUND OF THE INVENTION

1. Field of the Invention

The present invention relates to a multilayer piezoelectric element.

2. Description of Related Art

Figure 9:
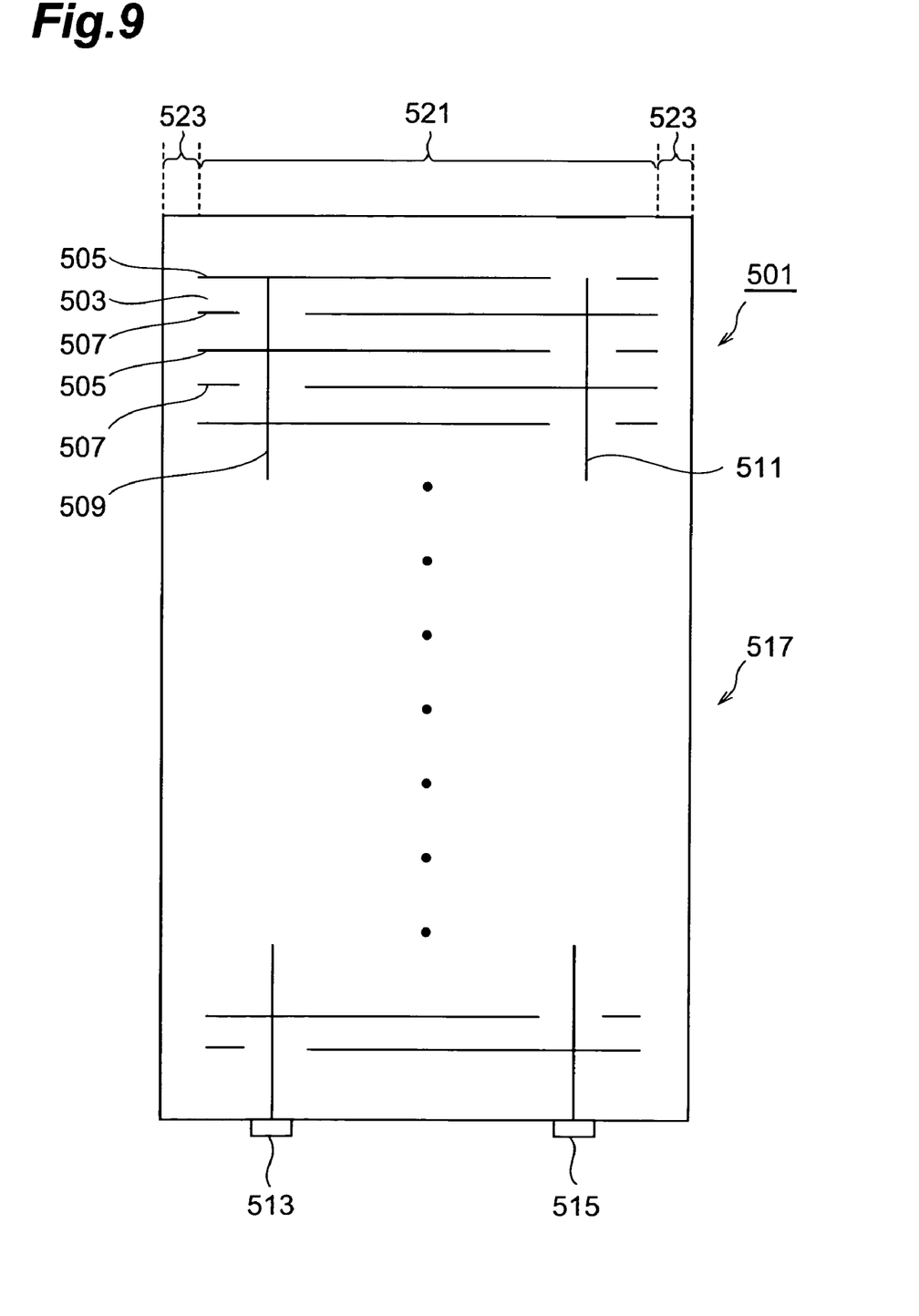
FIG. 9 is a sectional view showing a conventional multilayer piezoelectric element.

Multilayer piezoelectric elements are used as drivers such as fuel injectors of internal combustion engines for their ability to perform minute displacement. Conventionally, multilayer piezoelectric element 501 of which the cross section view is shown in FIG. 9 has been known. Multilayer piezoelectric element 501 is formed by laminating first internal electrodes 505 and second internal electrodes 507 alternately and disposing piezoelectric layer 503 between first internal electrode 505 and second internal electrode 507. In multilayer piezoelectric element 501, first internal electrodes 505 are connected to each other and second internal electrodes 507 are connected to each other via through holes respectively, and each internal electrode is positioned so as not to be exposed on side face 517 in order to prevent migration from occurring through side face 517.

First internal electrodes 505 are connected to each other via through hole 509 which penetrates piezoelectric layer 503 in the laminated direction so that first internal electrodes 505 are electrically connected to terminal 513. Second internal electrodes 507 are connected to each other via through hole 511 so that second internal electrodes 507 are electrically connected to terminal 515. First and second internal electrodes 505, 507 are disposed so that their periphery portions are positioned inside side face 517 (For example, see Japanese Laid-Open Patent Application No. 2000-261055).

SUMMARY OF THE INVENTION

However, as understood from the plane view of multilayer piezoelectric element 501, center area 521 where the internal electrodes exist, and surrounding area 523 where the internal electrodes do not exist are formed. Because thermal shrinkage ratios of the internal electrode and the piezoelectric layer are different from each other, the differential of thermal shrinkage between center area 521 and surrounding area 523 occurs in the burning process. Therefore, there has been a problem that the conventional multilayer piezoelectric element 501 distorts through the burning process due to the above-mentioned differential of thermal shrinkage.

An object of some embodiments of the present invention is to provide a multilayer piezoelectric element which can prevent the migration which occurs through the side face of the multilayer piezoelectric element and suppress the distortion in the burning process.

A multilayer piezoelectric element according to an aspect of the present invention includes a first internal electrode and a second internal electrode, the first internal electrode and the second internal electrode being laminated alternately. In addition, a piezoelectric layer is disposed between the first and second internal electrodes. A plurality of the first internal electrodes are connected to each other, and a plurality of the second internal electrodes are connected to each other, via through holes that penetrate the piezoelectric layer in the laminated direction of the first internal electrodes and the second internal electrodes. The first internal electrode is formed so that the periphery portion of the first internal electrode is exposed on a side face of the multilayer piezoelectric element. The second internal electrode is formed so that the periphery portion of the second internal electrode is positioned inside the side face of the multilayer piezoelectric element.

In the multilayer piezoelectric element of this aspect of the invention, the periphery portion of the first internal electrode is exposed on the side face of the multilayer piezoelectric element, while the periphery portion of the second internal electrode is positioned inside the side face. Therefore, it is possible to prevent the migration between the first internal electrode and the second internal electrode from occurring through the side face. In addition, as seen in the plan view, both the first internal electrode and the second internal electrode exist in the center area of the multilayer piezoelectric element. Further, the first internal electrode exists in the surrounding area that surrounds the center area. Therefore, the differential of the thermal shrinkage ratio between the center area and the surrounding area decreases with respect to the case where no internal electrode exists in the surrounding area, thereby suppressing the distortion in the burning process. Here, the internal electrode and the piezoelectric layer in the multilayer piezoelectric element contract in the burning process of the manufacturing process, with respect to the situation before the burning process. The "thermal shrinkage ratio" is the degree of the thermal shrinkage that occurs through the burning process.

A multilayer piezoelectric element according to another aspect of the present invention includes a first internal electrode and a second internal electrode, the first internal electrode and the second internal electrode being laminated alternately. In addition, a piezoelectric layer is disposed between the first and second internal electrodes, and a plurality of the first internal electrodes are connected to each other, and a plurality of the second internal electrodes are connected to each other, via through holes that penetrate the piezoelectric layer in the laminated direction of the first internal electrode and the second internal electrode. The first internal electrode is formed so that the periphery portion of the first internal electrode is exposed on a side face of the multilayer piezoelectric element. The second internal electrode is formed so that the periphery portion of the second internal electrode is positioned inside the side face of the multilayer piezoelectric element. A spacer layer is disposed between the periphery portion of the second internal electrode and the side face of the multilayer piezoelectric element, the spacer layer being electrically isolated from the second internal electrode.

In the multilayer piezoelectric element of this aspect of the invention, the periphery portion of the first internal electrode is exposed on the side face of the multilayer piezoelectric element, while the periphery portion of the second internal electrode is positioned inside the side face. Therefore, it is possible to prevent the migration between the first internal electrode and the second internal electrode from occurring through the side face. In addition, as seen in the plan view, both the first internal electrode and the second internal electrode exist in the center area of the multilayer piezoelectric element. Further, the first internal electrode and the spacer layer exist in the surrounding area that surrounds the center area. Therefore, the differential of the thermal shrinkage ratio between the center area and the surrounding area decreases with respect to the case where no internal electrode exists in the surrounding area, thereby suppressing the distortion in the burning process.

Preferably, the spacer layer is formed by a material having a thermal shrinkage ratio in a burning process that is closer to that of the second internal electrode than is the thermal shrinkage ratio of the piezoelectric layer. By making the thermal shrinkage ratio of the spacer layer close to that of the second internal electrode, the differential of the thermal shrinkage ratio between the center area and the surrounding area decreases further, thereby suppressing the distortion in the burning process even more.

Preferably, the spacer layer is formed by the same material as the second internal electrode. With this structure, the thermal shrinkage ratio of the spacer layer is the same as that of the second internal electrode. Therefore, the differential of the thermal shrinkage ratio between the center area and the surrounding area decreases further, thereby suppressing the distortion in the burning process even more.

Preferably, the spacer layer has the same thickness as the second internal electrode. With this structure, the amount of the thermal shrinkage of the spacer layer is close to that of the second internal electrode. Therefore, the differential of the thermal shrinkage ratio between the center area and the surrounding area decreases further, thereby suppressing the distortion in the burning process even more. Further, it is preferable that the spacer layer and the second internal electrode are formed by the same material and have the same thickness as each other. With this structure, the amount of the thermal shrinkage is the same as that of the second internal electrode, and therefore the differential of the thermal shrinkage ratio between the center area and the surrounding area decreases further. In addition, with this structure, the spacer layer can be pattern-formed at the same time as the second internal electrode.

A multilayer piezoelectric element according to another aspect of the present invention includes a first internal electrode and a second internal electrode, the first internal electrode and the second internal electrode being laminated alternately. In addition, a piezoelectric layer is disposed between the first and second internal electrodes, and a plurality of the first internal electrodes are connected to each other, and a plurality of the second internal electrodes are connected to each other, via through holes that penetrate the piezoelectric layer in the laminated direction of the first internal electrode and the second internal electrode. The first internal electrode and the second internal electrode are formed so that the periphery portions of the first internal electrode and the second internal electrode are positioned inside a side face of the multilayer piezoelectric element. Furthermore, a first spacer layer is disposed between the periphery portion of the first internal electrode and the side face of the multilayer piezoelectric element, the first spacer layer being electrically isolated from the first internal electrode. A second spacer layer is disposed between the periphery portion of the second internal electrode and the side face of the multilayer piezoelectric element, the second spacer layer being electrically isolated from the second internal electrode.

In the multilayer piezoelectric element of this aspect of the invention, the periphery portions of the first internal electrode and the second internal electrode are positioned inside the side face. Therefore, it is possible to prevent migration between the first internal electrode and the second internal electrode from occurring through the side face. In addition, as seen in the plan view, both the first internal electrode and the second internal electrode exist in the center area of the multilayer piezoelectric element. Further, the first spacer layer and the second spacer layer exist in the surrounding area that surrounds the center area. Therefore, the differential of the thermal shrinkage ratio between the center area and the surrounding area decreases with respect to the case where neither the internal electrode nor the spacer layer exists in the surrounding area, thereby suppressing the distortion in the burning process.

Preferably, the first spacer layer is formed by a material having a thermal shrinkage ratio in a burning process that is closer to that of the first internal electrode than is the thermal shrinkage ratio of the piezoelectric layer, and the second spacer layer is formed by a material having a thermal shrinkage ratio in the burning process that is closer to that of the second internal electrode than is the thermal shrinkage ratio of the piezoelectric layer. By making the thermal shrinkage ratios of the first and second spacer layers close to those of the first and second internal electrodes respectively, the differential of the thermal shrinkage ratio between the center area and the surrounding area decreases further, thereby suppressing the distortion in the burning process even more.

Further, it is preferable that the first spacer layer is formed by the same material as the first internal electrode, and the second spacer layer is formed by the same material as the second internal electrode. With this structure, the thermal shrinkage ratios of the first and second spacer layers are the same as those of the first and second internal electrodes respectively, and therefore the differential of the thermal shrinkage ratio between the center area and the surrounding area decreases further, thereby suppressing the distortion in the burning process even more.

Preferably, the first spacer layer has the same thickness as the first internal electrode, and the second spacer layer has the same thickness as the second internal electrode. With this structure, the thermal shrinkage ratios of the first and second spacer layers are close to those of the first and second internal electrodes respectively, and therefore the differential of the thermal shrinkage ratio between the center area and the surrounding area decreases further, thereby suppressing the distortion in the burning process even more. Further, it is preferable that the first and second spacer layers are formed by the same material and have the same thickness, with the first and second internal electrode respectively. With this structure, an amount of the thermal shrinkage between the center area and the surrounding area decreases further, thereby suppressing the distortion in the burning process even more. In addition, with this structure, the first and second spacer layers can be pattern-formed at the same time as the first and the second internal electrode, respectively.

A multilayer piezoelectric element according to another aspect of the present invention includes a first internal electrode and a second internal electrode, the first internal electrode and the second internal electrode being laminated alternately. In addition, a piezoelectric layer is disposed between the first and second internal electrodes. A conductive part is disposed on a side face of the multilayer piezoelectric element so that the conductive part is in contact with the first internal electrode, and the second internal electrode is formed so that the periphery portion of the second internal electrode is positioned inside a side face of the multilayer piezoelectric element. In addition, a plurality of the second internal electrodes are connected to each other via a through hole that penetrates the piezoelectric layer in the laminated direction of the first internal electrode and the second internal electrode.

In the multilayer piezoelectric element of this aspect of the invention, the periphery portion of the first internal electrode is exposed on the side face of the multilayer piezoelectric element, while the periphery portion of the second internal electrode is positioned inside the side face. Therefore, it is possible to prevent migration between the first internal electrode and the second internal electrode from occurring through the side face. In addition, as seen in the plan view, both the first internal electrode and the second internal electrode exist in the center area of the multilayer piezoelectric element. Further, the first internal electrode exists in the surrounding area that surrounds the center area. Therefore, the differential of the thermal shrinkage ratio between the center area and the surrounding area decreases with respect to the case where no internal electrode exists in the surrounding area, thereby suppressing the distortion in the burning process. Further, in this multilayer piezoelectric element, a plurality of the first internal electrode are electrically connected to each other via the conductive part at the periphery portions of the first internal electrodes exposed on the side face of the multilayer piezoelectric element. Therefore, the process of forming through holes for connecting a plurality of the first internal electrodes is not necessary.

Further, it is preferable that the second internal electrode may comprise a plurality of individual electrodes that are disposed in a matrix. With this structure, the voltage can be independently applied to each individual electrode, and therefore it becomes possible to form a plurality of displacement portions in a multilayer piezoelectric element.

In addition, the multilayer piezoelectric element may include a terminal electrode positioned on the outermost face of the multilayer piezoelectric element in the laminated direction, wherein a drive power is supplied through the terminal electrode.

The present invention will be more fully understood from the detailed description of exemplary embodiments given hereinbelow, and the accompanying drawings which are given by way of illustration only, and thus are not to be considered as limiting.

DESCRIPTION OF PREFERRED EMBODIMENTS

Preferred, exemplary embodiments of the present invention will be explained in detail with reference to the accompanying drawings. In the figures, like reference numerals identify like elements.

First Embodiment

Figure 1:
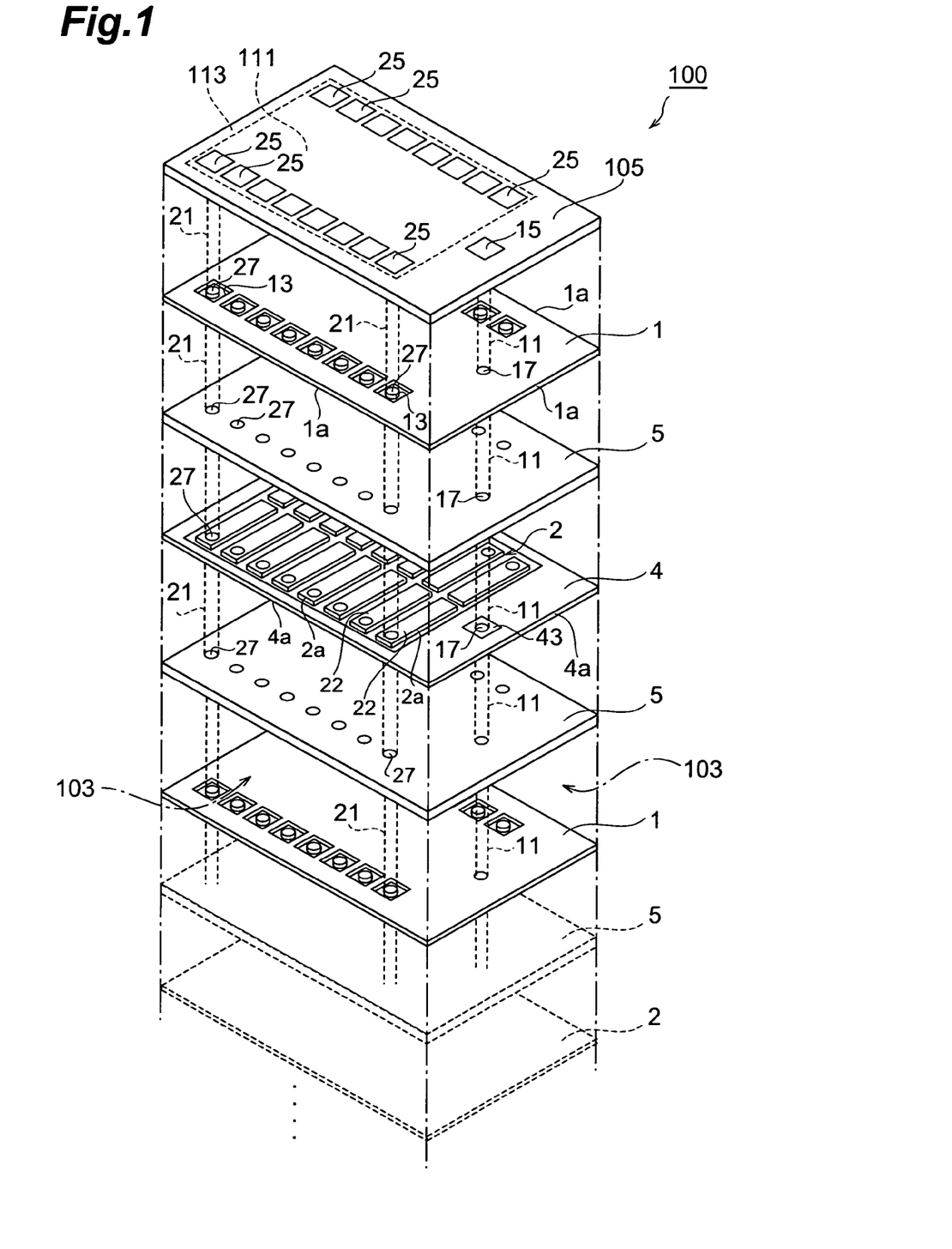
FIG. 1 is an exploded perspective view showing a multilayer piezoelectric element in accordance with a first embodiment.

FIG. 1 is an exploded perspective view showing multilayer piezoelectric element 100 according to a first embodiment of the present invention. Multilayer piezoelectric element 100 includes a plurality of first internal electrodes 1, second internal electrodes 2, spacer layers 4, and piezoelectric layers 5. First internal electrodes 1 and second internal electrodes 2 are laminated alternately while piezoelectric layers 5 are held therebetween. The shape of multilayer piezoelectric element 100 in the plan view is rectangular, with a size of 10 mm×15 mm for example. In the multilayer piezoelectric element 100 of the present embodiment, five first internal electrodes 1 and second internal electrodes 2 are laminated, respectively. Hereinafter, the direction in which first internal electrode 1, second internal electrode 2, and piezoelectric layer 5 are laminated is referred to as "laminated direction."

Piezoelectric layer 5 is mainly composed of ceramics such as lead zirconate titanate and is formed into a thin rectangular sheet of 10 mm×15 mm with a thickness of 50 µm, for example. First through hole 11 and second through hole 21 penetrate piezoelectric layer 5 in the laminated direction. First through hole 11 and second through hole 21 extend along almost the entirety of the multilayer piezoelectric element 100 in the laminated direction. The insides of first and second through holes 11, 21 are filled with conductive substances 17, 27, respectively. Each of the second through holes 21 is provided so as to correspond to each of the individual electrodes 22 of the second internal electrode 2, and thereby a plurality of individual electrodes 22 corresponding to each other in the laminated direction are electrically connected by conductive substance 27.

Figure 2:
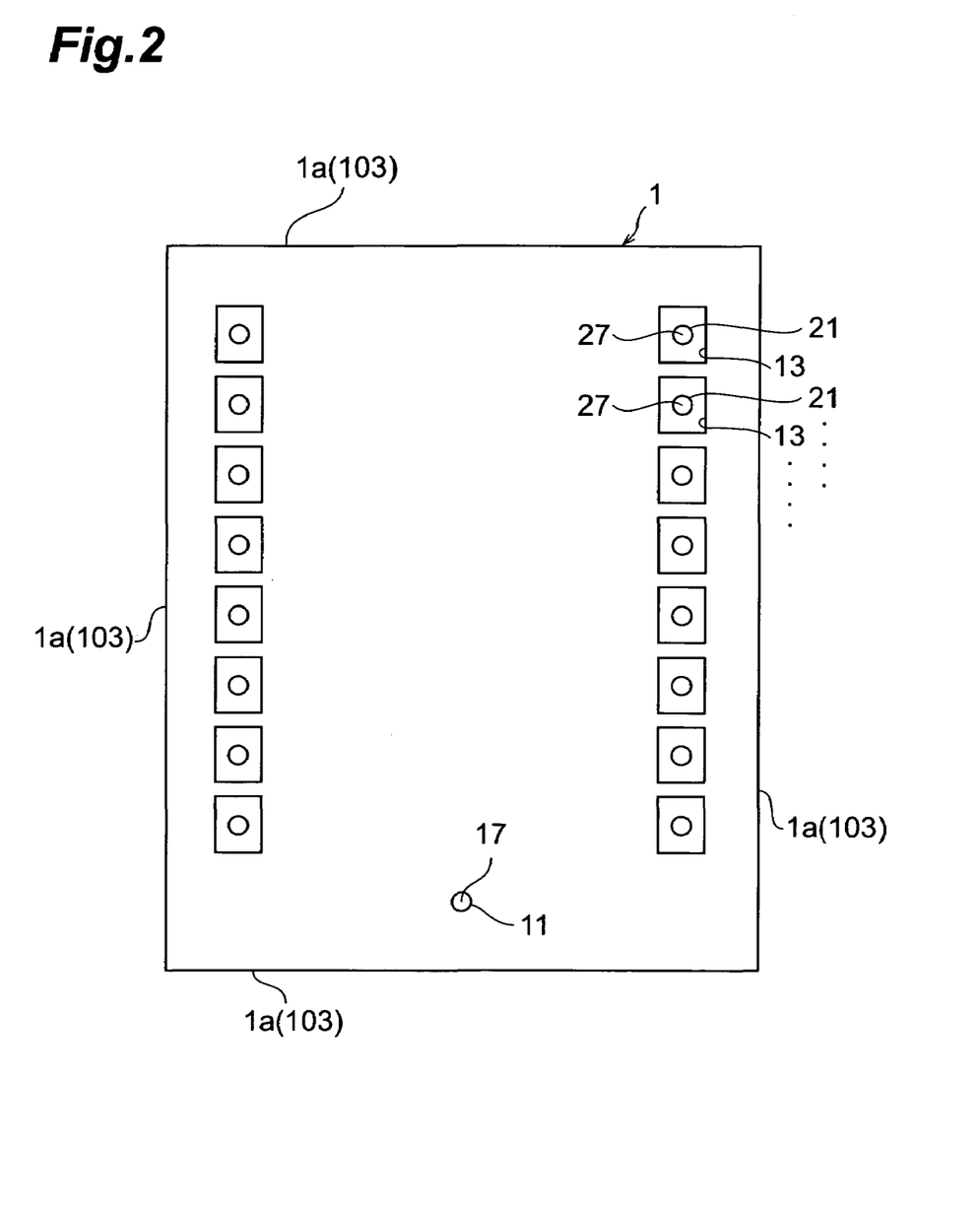
FIG. 2 is a plan view showing the first internal electrode.

FIG. 2 is a plan view showing first internal electrode 1. First internal electrode 1 is mainly composed of silver and palladium, for example, and formed as patterns on piezoelectric layer 5 by screen printing. First internal electrode 1 is formed on the entirety of the piezoelectric layer 5 as seen in the plan view so that all four periphery portions 1a of first internal electrode 1 are exposed on side face 103 of multilayer piezoelectric element 100. Each of first internal electrodes 1 is electrically connected to each other by conductive substance 17 filled within first through hole 11. First internal electrode 1 has insulating gap 13 at a position corresponding to second through hole 21. Because second through hole 21 penetrates insulating gap 13 so as not to be in contact with first internal electrode 1, first internal electrode 1 and second through hole 21 are insulated from each other.

Figure 3:
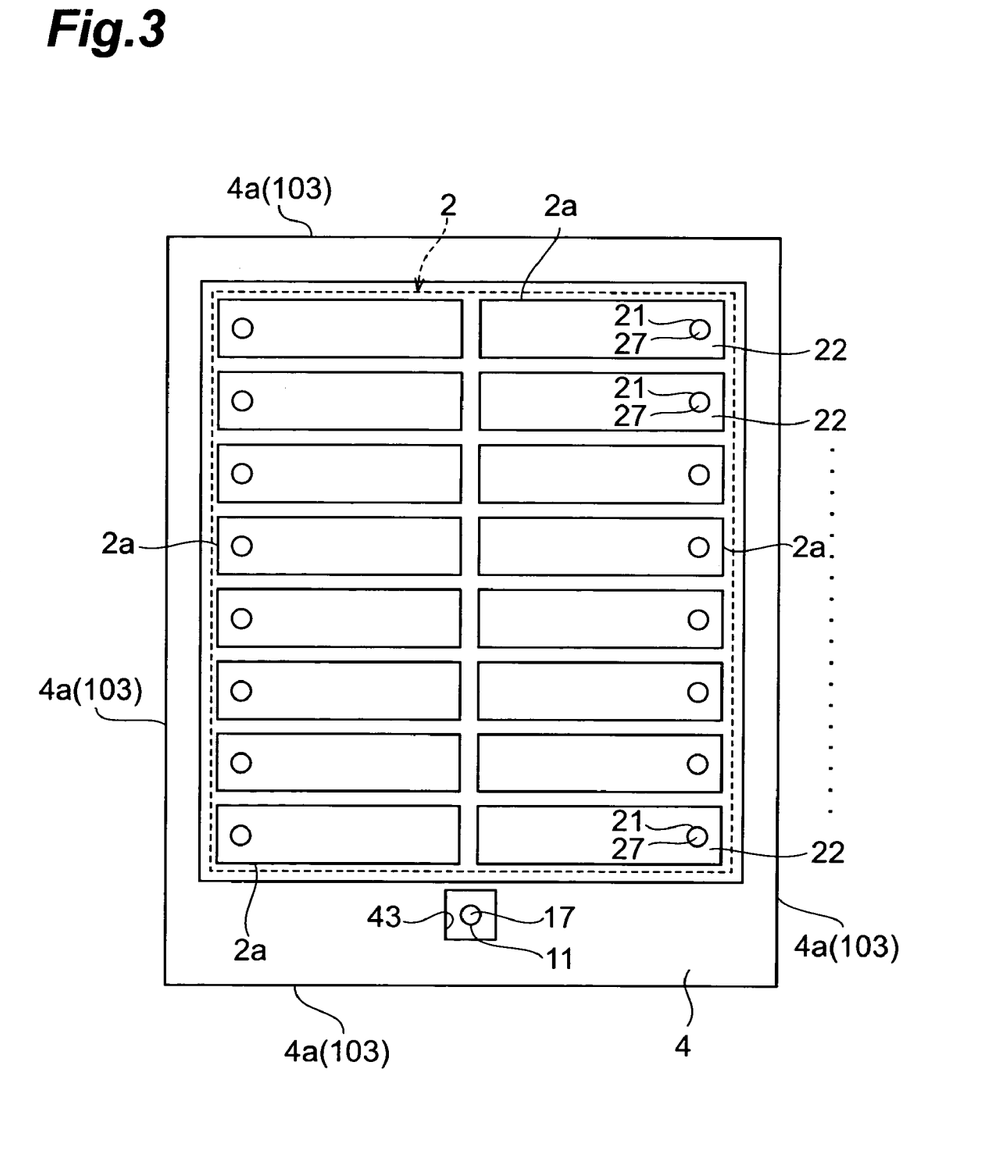
FIG. 3 is a plan view showing the second internal electrode and a spacer layer.

FIG. 3 is a plan view showing second internal electrode 2 and spacer layer 4. Like first internal electrode 1, second internal electrode 2 is mainly composed of silver and palladium, for example, and formed as patterns on piezoelectric layer 5 by screen printing. Second internal electrode 2 is configured by a plurality of individual electrodes 22 that are disposed in a matrix. In this embodiment, sixteen individual electrodes 22 are arranged in a matrix of 2 columns by 8 rows. Periphery portion 2a of second internal electrode 2 is positioned inside side face 103 of multilayer piezoelectric element 100 so that periphery portion 2a is not exposed on side face 103. Here, the edge of the rectangular area in which individual electrodes 22 are arranged is referred to as periphery portion 2a of second internal electrode 2. Each individual electrode 22 has a rectangular shape and is arranged so that its longitudinal direction is perpendicular to the longitudinal direction of piezoelectric layer 5. Adjacent individual electrodes 22, 22 have a predetermined gap therebetween, so as to be electrically isolated from each other, and so as to be kept from affecting each other upon vibration. Second through hole 21 penetrates the outer end in the longitudinal direction of each individual electrode 22. Each of the individual electrodes 22 is electrically connected to each other by conductive substance 27 filled within the second through hole 21 that penetrates each individual electrode 22. Therefore, individual electrodes 22 corresponding in the laminated direction are electrically connected to each other via conductive substance 27.

Spacer layer 4 has a rectangular ring shape and surrounds second internal electrode 2. Periphery portion 4a of spacer layer 4 is exposed on side face 103. The predetermined gap is formed between spacer layer 4 and individual electrodes 22, and thereby spacer layer 4 is electrically isolated from second internal electrode 2. Although all four periphery portions 4a of spacer layer 4 are exposed on side face 103 in this embodiment, periphery portion 4a may be positioned inside side face 103. Insulating gap 43 is formed at a position corresponding to first through hole 11, in first spacer layer 4. Because first through hole 11 penetrates insulating gap 43 so as not to be in touch with spacer layer 4, spacer layer 4 and first through hole 11 are electrically insulated from each other. Alternatively, insulating gap 43 may be omitted so that spacer layer 4 and first internal electrode 1 might be electrically connected to each other. With this structure, the electrical resistance of the side of first internal electrode 1 can be lowered. Spacer layer 4 is mainly composed of the same material with second internal electrode 2, i.e. silver and palladium. That is, spacer layer 4 is formed by a material having a thermal shrinkage ratio in a burning process that is higher than that of piezoelectric layer 5 and is closer to that of second internal electrode 2 than is that of piezoelectric layer 5 (in this embodiment, the material of spacer layer 4 is the same as that of second internal electrode 2). Spacer layer 4 has the same thickness as second internal electrode 2. Therefore, spacer layer 4 may be formed as patterns on piezoelectric layer 5 at the same time with second internal electrode 2.

Referring to FIG. 1, multilayer piezoelectric element 100 is provided with first terminal electrode 15 and second terminal electrode 25 on outermost face 105 in the laminated direction. The drive power from the outside is supplied through first and second terminal electrodes 15, 25 so as to activate multilayer piezoelectric element 100. First terminal electrode 15 is electrically connected to first internal electrode 1 via conductive substance 17 filled within first through hole 11. Each second terminal electrode 25 is electrically connected to the corresponding individual electrode 22 of second internal electrode 2 via conductive substance 27 filled within second through hole 21. On the activation of multilayer piezoelectric element 100, an electric potential difference is formed between first terminal electrode 15 and second terminal electrode 25 by the drive power from the outer electric power supply (not shown in the drawing) so as to generate the electric field, and thereby piezoelectric layer 5 held between both internal electrodes is displaced. Because it is possible to generate the electric field independently with respect to each of the second terminal electrodes 25, only the corresponding portion of piezoelectric layer 5 can be displaced.

Next, the manufacturing process of multilayer piezoelectric element 100 will be explained. First, a piezoelectric material mainly composed of ceramics such as lead zirconate titanate is mixed with an organic binder, an organic solvent, or the like, so as to yield a base paste. From the base paste, green sheets to become piezoelectric layer 5 are formed. Each green sheet has a thickness of 50 μm. Also, metal material composed of silver and palladium at a predetermined ratio is mixed with an organic binder, an organic solvent, or the like, so as to yield a conductive paste.

Subsequently, the green sheets to become piezoelectric layer 5 are irradiated with laser light at predetermined positions, so as to form first through hole 11 and second through hole 21. For example, third harmonics of YAG laser is used in the process and the hole diameter of the through holes are set to about 40-50 μm. Thereafter, first through hole 11 and second through hole 21 are subjected to filling screen printing with a conductive paste, so as to form conductive substances 17, 27. The conductive paste used in the process is made by mixing a metal powder having the component of Ag:Pd=3:7 with an organic binder, an organic solvent, or the like.

Thereafter, green sheets to become piezoelectric layer 5 are subjected to screen printing with the pattern of first internal electrode 1 by using conductive paste, so as to form first internal electrode 1. Similarly, green sheets are subjected to screen printing with the pattern of second internal electrode 2 and spacer layer 4, so as to form second internal electrode 2 and spacer layer 4 together. That is, in this embodiment, two types of green sheets are formed. The pattern of first internal electrode 1 is formed on one green sheet, and the patterns of second internal electrode 2 and spacer layer 4 are formed on the other green sheet. The green sheet to become piezoelectric layer 5 having outermost face 105 is subjected to screen printing by using a conductive paste, so as to form first terminal electrode 15 and second terminal electrode 25. The conductive paste used here is the same with that used in the above-mentioned filling screen printing, for example.

The two types of green sheets on which electrode patterns are formed are laminated alternately, and the thus laminated green sheets are pressed in the laminated direction at a pressure of 100 MPa and heated at 60° C., so as to yield a green laminate. The green laminate is cut so as to be a size of 10 mm×15 mm. The cut green laminates are degreased at about 400° C. and fired at 1100° C. for two hours in a sealed pot, so as to yield sintered bodies.

Next, baked electrodes of silver are formed on terminal electrodes 15, 25 of the sintered sheet to become piezoelectric layer 5, so as to form the terminals for connecting the leads. Thereafter, the sintered body is polarized at 120° C. for three minutes at an electric field of 3 kv/mm, so as to yield multilayer piezoelectric element 100. Terminal electrodes 15, 25 may be formed by Au or Cu instead of Ag. In addition, as a forming process of terminal electrodes 15, 25, sputtering, vapor deposition, electroless deposition, and the like are adopted instead of baking.

In multilayer piezoelectric element 100, periphery portion 1a of first internal electrode 1 is exposed on side face 103, while periphery portion 2a of second internal electrode 2 is positioned inside side face 103. In addition, although periphery portion 4a of spacer layer 4 is exposed on side face 103, spacer layer 4 is electrically insulated from second internal electrode 2. Therefore, it is possible to prevent migration between first internal electrode 1 and second internal electrode 2 from occurring through side face 103. In addition, as seen in the plan view of multilayer piezoelectric element 100, in center area 111 (see FIG. 1) that is the inside of periphery portion 2a of second internal electrode 2, both first internal electrode 1 and second internal electrode 2 exist. Further, in surrounding area 113 that is the outside of periphery portion 2a of second internal electrode 2 and surrounds center area 111, both first internal electrode 1 and spacer layer 4 exist. Therefore, the differential of the thermal shrinkage ratio between center area 111 and surrounding area 113 decreases with respect to the case where neither the internal electrode nor the spacer layer exists in surrounding area 113, thereby suppressing distortion, strain, and cracking in the burning process.

Further, spacer layer 4 is formed of the same material as second internal electrode 2. Therefore, the thermal shrinkage ratio of spacer layer 4 becomes the same as second internal electrode 2. Thus, the differential of the thermal shrinkage ratio between center area 111 and surrounding area 113 decreases further, thereby suppressing distortion, strain, and cracking in the burning process even more. Although, in the view point of decreasing the distortion through the burning process, it is preferable that spacer layer 4 be formed of the same material as second internal electrode 2 so as to make their thermal shrinkage ratios identical, the invention is not limited to such a configuration. That is, when spacer layer 4 is formed by a material having a thermal shrinkage ratio that is closer to that of second internal electrode 2 than is that of the piezoelectric layer 5, the effect of suppressing the distortion through the burning process can be achieved.

In addition, spacer layer 4 has the same thickness with second internal electrode 2. With this structure, the amount of the thermal shrinkage of spacer layer 4 is close to that of the second internal electrode. Therefore, the differential of the thermal shrinkage ratio between center area 111 and surrounding area 113 decreases further, thereby suppressing distortion, strain, and cracking in the burning process even more. Further, because spacer layer 4 and second internal electrode 2 are formed of the same material and have identical thicknesses, spacer layer 4 can be pattern-formed by screen printing at the same time as second internal electrode 2.

In multilayer piezoelectric element 100, a plurality of first internal electrodes 1 are electrically connected to each other via first through holes 11, and a plurality of second internal electrodes 2 are electrically connected to each other via second through holes 21. Therefore, it is not necessary to electrically connect these electrodes via side face 103, thereby making it possible to eliminate the insulating process of insulating each electrode exposed on side face 103. In addition, because it is not necessary to connect each electrode via side face 103, it becomes possible to eliminate the polishing process (barrel polishing process) of polishing side face 103 in order to expose both of the burned electrodes entirely on side face 103.

Further, second internal electrode 2 is configured by a plurality of individual electrodes 22 that are disposed in a matrix. Therefore, by applying a voltage to each individual electrode independently, it becomes possible to form a plurality of displacement portions, and to perform minute displacements in multilayer piezoelectric element 100.

Figure 4:
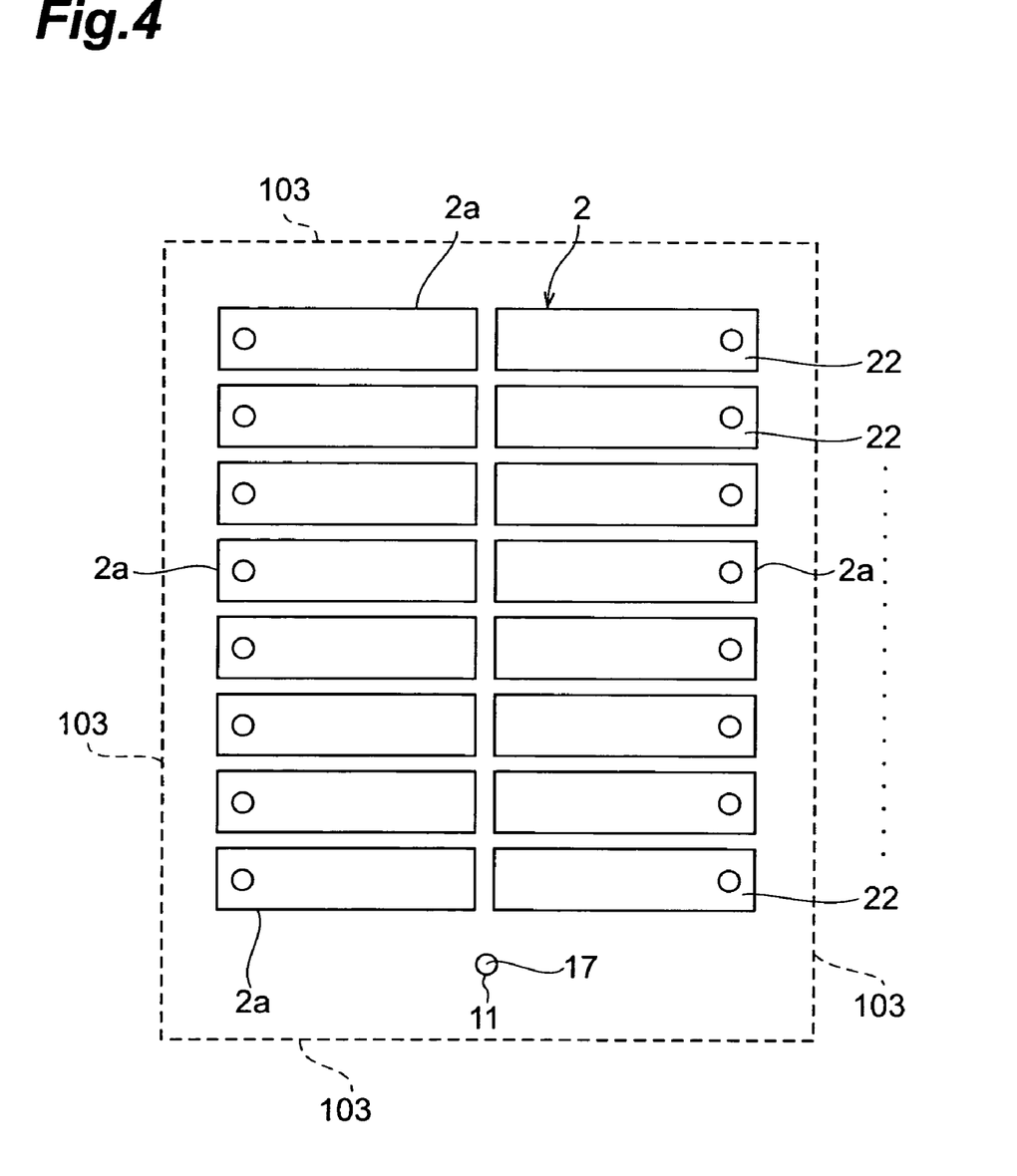
FIG. 4 is a plan view showing the second internal electrode in the multilayer piezoelectric element in accordance with an alternative embodiment.

As described with respect to multilayer piezoelectric element 100, it is preferable to form spacer layer 4 so that spacer layer 4 surrounds second internal electrode 2, in order to decrease the difference of the thermal shrinkage ratios between center area 111 and surrounding area 113. However, a configuration without spacer layer 4 can be adopted. FIG. 4 shows a second internal electrode with such a configuration in multilayer piezoelectric element 100. In this configuration, as seen in the plan view of multilayer piezoelectric element 100 (shown in FIG. 1), in center area 111, both first internal electrode 1 and second internal electrode 2 exist, while first internal electrode 1 exists in surrounding area 113. Therefore, the differential of the thermal shrinkage ratio between center area 111 and surrounding area 113 decreases with respect to the case where internal electrode does not exist in surrounding area 113, thereby suppressing distortion, strain, and cracking in the burning process.

Second Embodiment

Next, with reference to FIG. 5, multilayer piezoelectric element 200 according to a second embodiment of the present invention will be explained. The difference between multilayer piezoelectric element 200 and multilayer piezoelectric element 100 is in the structure of first internal electrode 201. The explanation of the other structures of multilayer piezoelectric element 200 will be omitted because they are the same as those of multilayer piezoelectric element 100.

Figure 5:
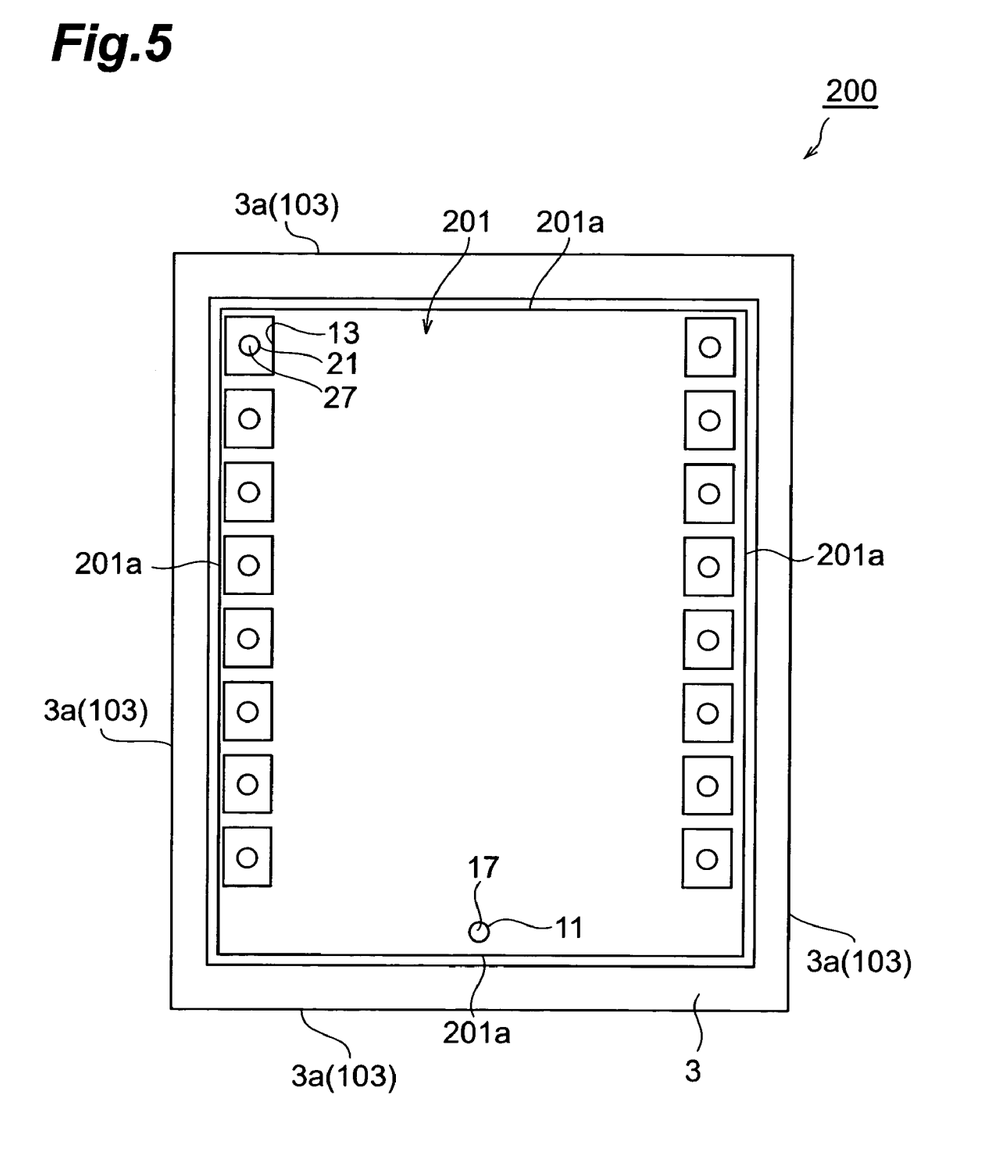
FIG. 5 is a plan view showing the first internal electrode in the multilayer piezoelectric element in accordance with a second embodiment.

FIG. 5 is a plan view showing first internal electrode 201 of multilayer piezoelectric element 200. Periphery portion 201a of first internal electrode 201 is positioned inside side face 103 of multilayer piezoelectric element 200 so that periphery portion 201a is not exposed on side face 103.

Multilayer piezoelectric element 200 is provided with spacer layer 3 (first spacer layer) in addition to spacer layer 4 (second spacer layer). Spacer layer 3 is positioned at a position held between first internal electrode 201 and side face 103, and surrounds first internal electrode 201. A predetermined gap is formed between spacer layer 3 and first internal electrode 201, and thereby spacer layer 3 is electrically isolated from first internal electrode 201. Although all four periphery portions 3a of spacer layer 3 are exposed on side face 103, one or all of the periphery portions 3a may be positioned inside side face 103. Spacer layer 3 is mainly composed of the same material as first internal electrode 201, i.e., silver and palladium and has the same thickness as first internal electrode 201. Therefore, spacer layer 3 may be formed as patterns on piezoelectric layer 5 at the same time as first internal electrode 201.

In multilayer piezoelectric element 200, periphery portion 201a of first internal electrode 201 and periphery portion 2a of second internal electrode 2 are positioned inside of side face 103. In addition, although periphery portion 3a of spacer layer 3 is exposed on side face 103, spacer layer 3 is electrically insulated from first internal electrode 201. Further, although periphery portion 4a of spacer layer 4 is exposed on side face 103, spacer layer 4 is electrically insulated from second internal electrode 2. Therefore, it is possible to prevent migration between first internal electrode 201 and second internal electrode 2 from occurring through side face 103. In addition, as seen in the plan view of multilayer piezoelectric element 200, in center area 111 (see FIG. 1), both first internal electrode 201 and second internal electrode 2 exist. Further, in surrounding area 113, both spacer layer 3 and spacer layer 4 exist. Therefore, the differential of the thermal shrinkage ratio between center area 111 and surrounding area 113 decreases with respect to the case where neither the internal electrode nor the spacer layer exists in surrounding area 113, thereby suppressing distortion, strain, and cracking in the burning process.

Further, spacer layer 3 is formed of the same material as first internal electrode 201, and spacer layer 4 is formed of the same material as second internal electrode 2. Therefore, the thermal shrinkage ratios of spacer layers 3, 4 become the same as those of the first and second internal electrodes 201, 2, respectively. Thus, the differential of the thermal shrinkage ratio between center area 111 and surrounding area 113 decreases further, thereby suppressing distortion, strain, and cracking in the burning process more and more. Although, in the view point of decreasing the distortion through the burning process, it is preferable that spacer layer 3 is formed of the same material as first internal electrode 201, and spacer layer 4 is formed of the same material as second internal electrode 2, so as to make the thermal shrinkage ratios identical, the invention is not limited to this configuration. That is, when spacer layer 3 is formed by a material having a thermal shrinkage ratio that is closer to that of first internal electrode 201 than is that of the piezoelectric layer 5, and spacer layer 4 is formed of a material having a thermal shrinkage ratio that is closer to that of second internal electrode 2 than is that of the piezoelectric layer 5, the effect that suppresses the distortion through the burning process can be achieved.

In addition, spacer layers 3, 4 have the same thickness as first and second internal electrode 201, 2, respectively. With this structure, the amounts of thermal shrinkage of spacer layers 3, 4 are close to those of the first and second internal electrodes 201, 2, respectively. Therefore, the differential of the amount of thermal shrinkage ratio between center area 111 and surrounding area 113 decreases further, thereby suppressing distortion, strain, and cracking in the burning process even more. Further, because spacer layer 3 and first internal electrode 201 are formed of the same material and have identical thicknesses, and spacer layer 4 and second internal electrode 2 are formed of the same material and have identical thicknesses, spacer layer 3, 4 can be pattern-formed by screen printing at the same time as first and second internal electrodes 201, 2, respectively.

In multilayer piezoelectric element 200, a plurality of first internal electrodes 201 are electrically connected to each other via first through holes 11 and a plurality of second internal electrodes 2 are electrically connected to each other via second through holes 21. Therefore, it is not necessary to electrically connect these electrodes via side face 103, thereby making it possible to eliminate the insulating process of insulating each electrode exposed on side face 103. In addition, because it is not necessary to connect each electrode via side face 103, it becomes possible to eliminate the polishing process (barrel polishing process) of polishing side face 103 in order to expose both of the burned electrodes entirely on side face 103.

Third Embodiment

Next, with reference to FIGS. 6 and 7, multilayer piezoelectric element 300 according to a third embodiment of the present invention will be explained. The difference between multilayer piezoelectric element 300 and multilayer piezoelectric element 100 is in the connection of first internal electrodes 301.

Figure 6:
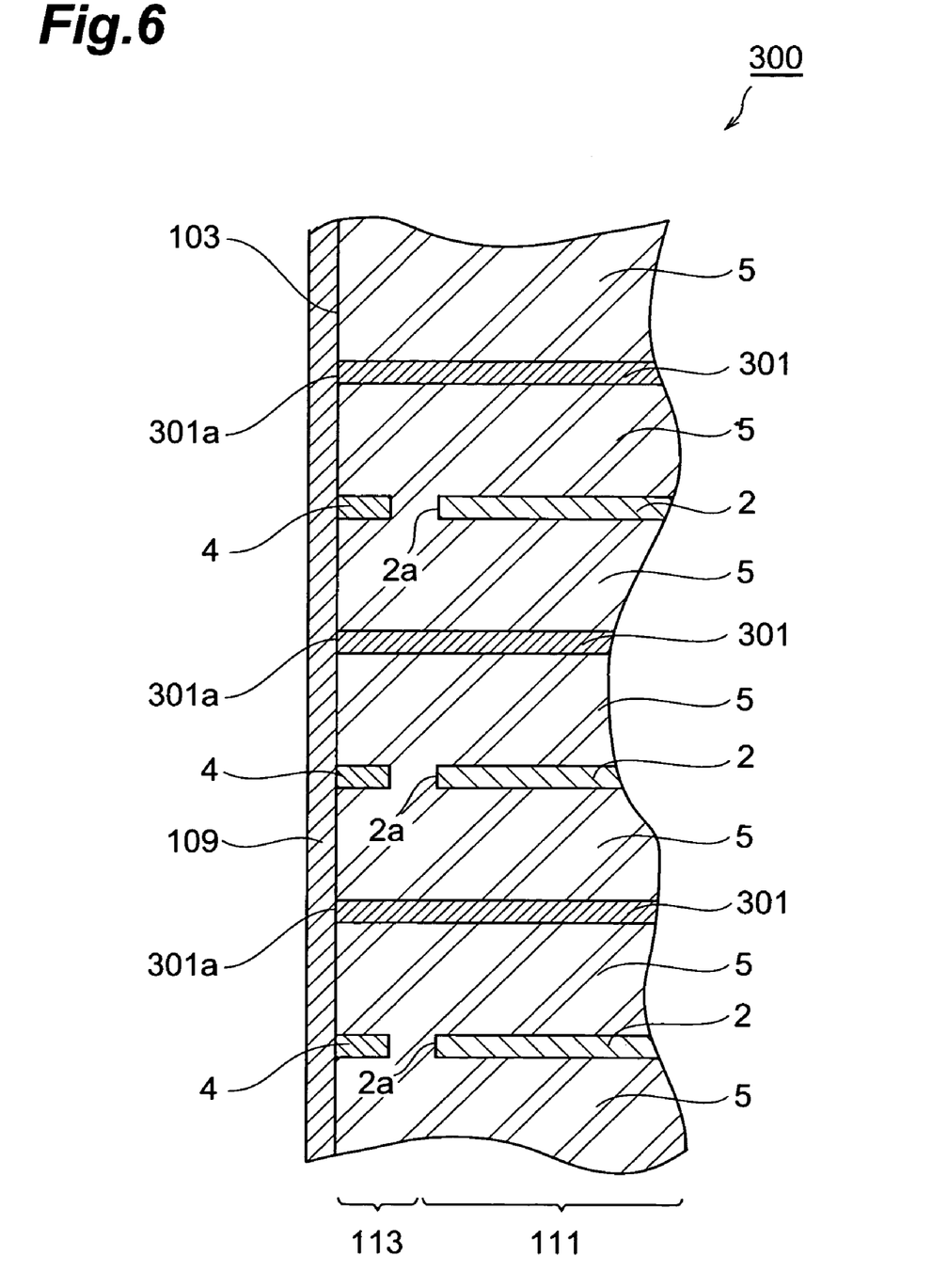
FIG. 6 is a longitudinal sectional view showing an area around the side face of the multilayer piezoelectric element in accordance with a third embodiment.
Figure 7A:
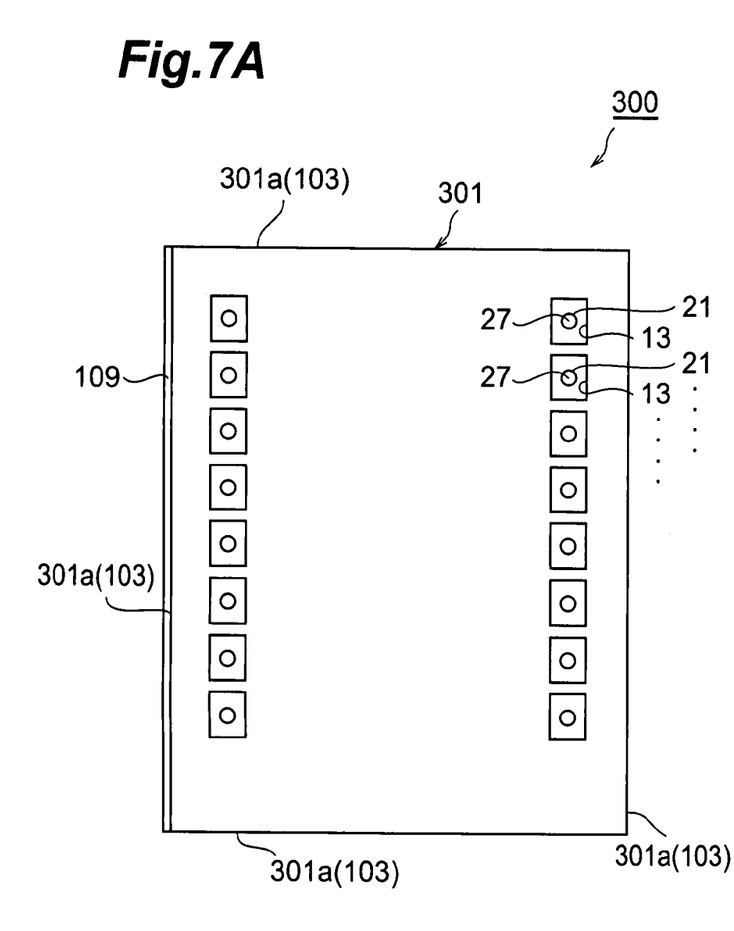
FIG. 7A is a plan view showing the first internal electrode in the multilayer piezoelectric element in accordance with the third embodiment.
Figure 7B:
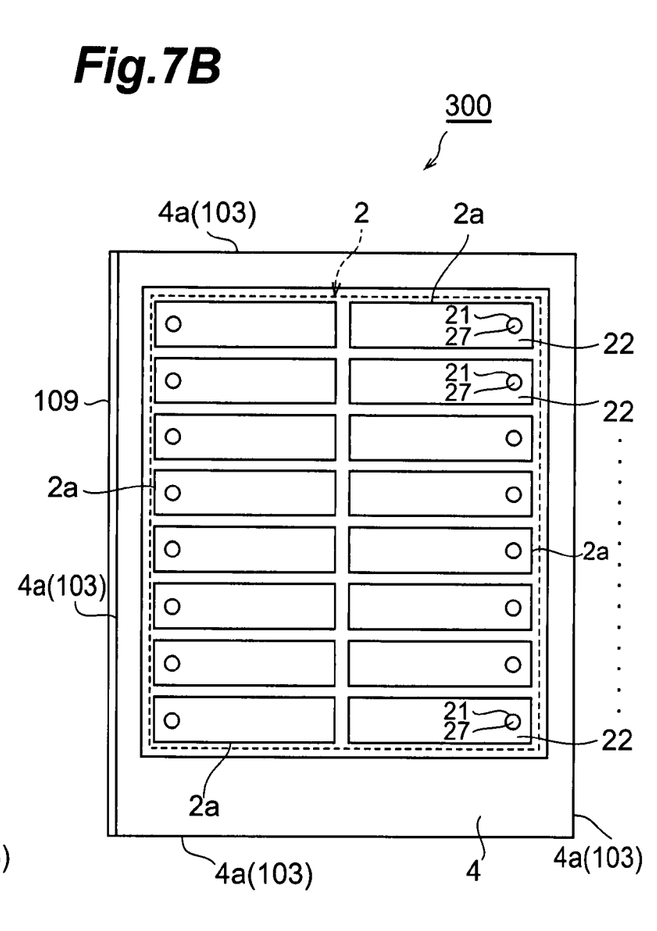
FIG. 7B is a plan view of the second internal electrode.

FIG. 6 is a longitudinal sectional view showing an area around side face 103 of multilayer piezoelectric element 300. FIG. 7A is a plan view showing first internal electrode 301, and FIG. 7B is a plan view of second internal electrode 2. Periphery portion 301a of first internal electrode 301 is exposed on side face 103. Conductive part 109 formed by a conductive material is disposed on side face 103. Conductive part 109 is formed so as to be in contact with periphery portion 301a exposed on side face 103 and to cover side face 103. As long as conductive part 109 is in contact with each periphery portion 301a, it is not necessary for conductive part 109 to cover all of side face 103. For example, conductive part 109 can be formed so as to include a plurality of belt-shaped portions that are extended in the laminated direction and are arranged in parallel, so that the belt-shaped portions cover a part of side face 103 containing periphery portions 301a. A plurality of first internal electrodes 301 are connected to each other via conductive part 109 that is in contact with periphery portions 301a. The other structures are the same as those of multilayer piezoelectric element 100, and therefore their explanation will be omitted.

In multilayer piezoelectric element 300, periphery portion 301a of first internal electrode 301 is exposed on side face 103, while the periphery portion 2a of second internal electrode 2 is positioned inside side face 103. Therefore, it is possible to prevent migration between first internal electrode 301 and second internal electrode 2 from occurring through side face 103. In addition, as seen in the plan view, in the center area 111, both first internal electrode 301 and second internal electrode 2 exist. Further, in the surrounding area 113, first internal electrode 301 and spacer layer 4 exist. Therefore, the differential of the thermal shrinkage ratio between the center area and the surrounding area decreases with respect to the case where neither the internal electrode nor the spacer layer exists in the surrounding area, thereby suppressing the distortion in the burning process. Further, in multilayer piezoelectric element 300, a plurality of first internal electrodes 301 are electrically connected to each other via conductive part 109 at periphery portions 301a of first internal electrodes 301 exposed on side face 103. Therefore, the process of forming through holes for connecting a plurality of first internal electrodes 301 is not necessary. Thus, by eliminating the process of forming through holes that must generally be performed at a high precision, the yield of multilayer piezoelectric element 300 increases.

Further, in multilayer piezoelectric element 300, although it is preferable that spacer layer 4 is disposed so as to surround second internal electrode 2 because the difference of thermal shrinkage ratio between center area 111 and surrounding are 113 can be decreased, it is not necessary to provide spacer layer 4 in the present invention. In the case where spacer layer 4 is not provided, in the center area 111, both first internal electrode 301 and second internal electrode 2 exist, while in the surrounding area 113, first internal electrode 301 exists. Therefore, the differential of the thermal shrinkage ratio between the center area and the surrounding area decreases with respect to the case where neither the internal electrode nor the spacer layer exists in the surrounding area, thereby suppressing distortion, strain, and cracking in the burning process. Alternatively, it is not necessary for periphery portion 301a of first internal electrode 301 and the periphery portion of spacer layer 4 to be positioned on the same flat surface with side face 103. For example, the periphery portion 301a of first internal electrode 301 and the periphery portion of spacer layer 4 may be positioned at the inside of side face 103 by the length of a few micrometers. This is caused by the slight difference between the thermal shrinkage ratios of first internal electrode 301 and/or spacer layer 4 and the thermal shrinkage ratio of piezoelectric layers 5. With this structure, the advantage of this embodiment also can be attained.

Figure 8A:
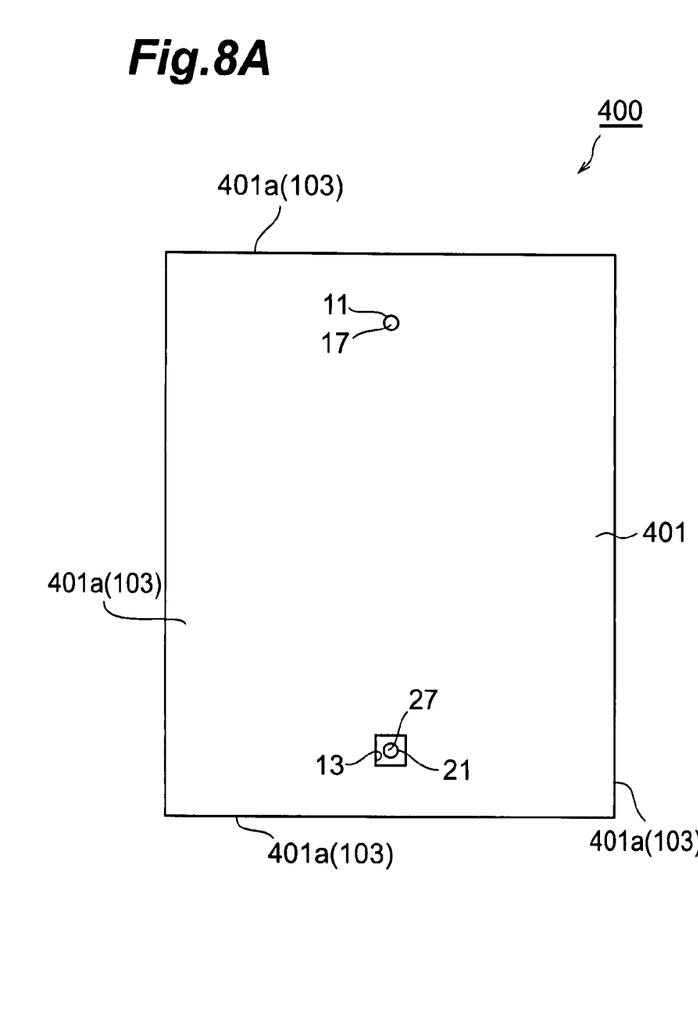
FIG. 8A is a plan view showing the first internal electrode in the multilayer piezoelectric element in accordance with an alternative embodiment.
Figure 8B:
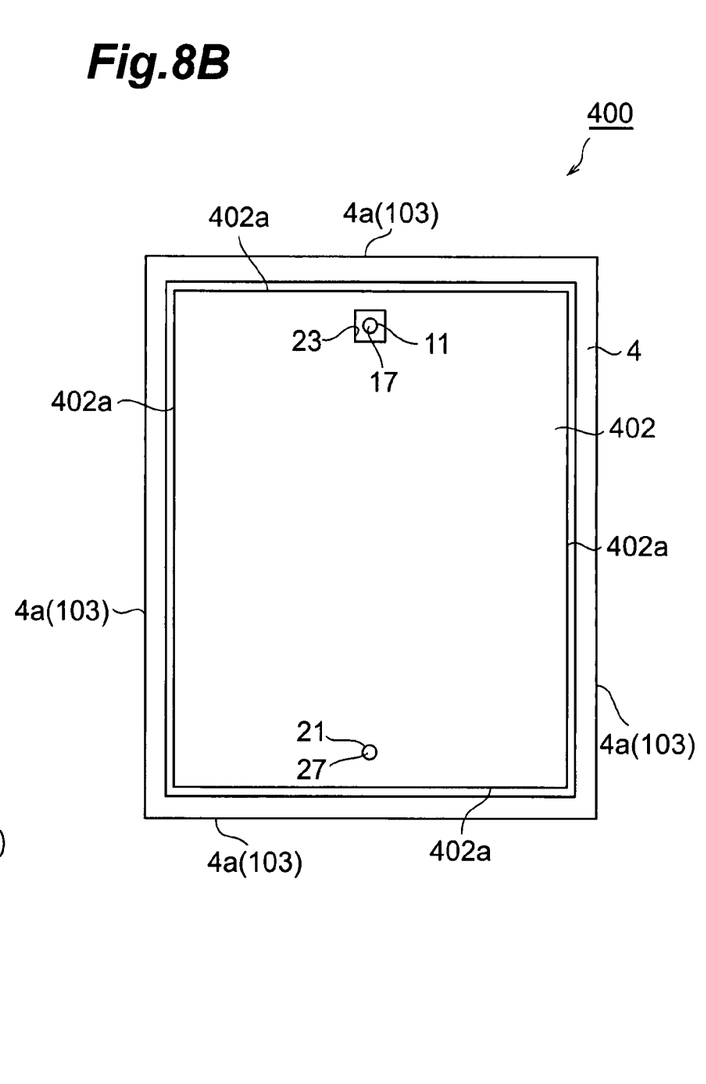
FIG. 8B is a plan view of the second internal electrode.

Although, in the first, second, and third embodiments described above, second internal electrode 2 is configured by a plurality of individual electrodes 22, the invention is not limited to this structure. FIG. 8A and FIG. 8B show an alternative embodiment. FIG. 8A is a plan view showing first internal electrode 401 in multilayer piezoelectric element 400, and FIG. 8B is a plan view of second internal electrode 402. In this embodiment, second internal electrode 402 is formed by one sheet-like electrode. In addition, periphery portion 401a of first internal electrode 401 is exposed on side face 103, while periphery portion 402a of second internal electrode 402 is positioned inside side face 103.

According to aspects of the present invention, a multilayer piezoelectric element is provided which can prevent the migration which occurs through the side face of the multilayer piezoelectric element, and suppress the distortion in the burning process.

What is claimed is:

1. A multilayer piezoelectric element comprising:
    a first internal electrode and a second internal electrode, the first internal electrode and the second internal electrode being laminated alternately; and
    a piezoelectric layer disposed between the first and second internal electrodes; wherein
    a plurality of the first internal electrodes are connected to each other, and a plurality of the second internal electrodes are connected to each other, via through holes that penetrate the piezoelectric layer in a laminated direction of the first internal electrode and the second internal electrode;
    the first internal electrode is formed so that an entire periphery portion of the first internal electrode is exposed on a side face of the multilayer piezoelectric element; and
    the second internal electrode is formed so that an entire periphery portion of the second internal electrode is positioned inside the side face of the multilayer piezoelectric element.

2. A multilayer piezoelectric element according to claim 1, wherein each of the second internal electrodes comprises a plurality of individual electrodes that are disposed in a matrix.

3. A multilayer piezoelectric element according to claim 1, further comprising a terminal electrode positioned on an outermost face of the multilayer piezoelectric element in the laminated direction; wherein
    a drive power is supplied through the terminal electrode.

4. A multilayer piezoelectric element comprising:
    a first internal electrode and a second internal electrode, the first internal electrode and the second internal electrode being laminated alternately; and
    a piezoelectric layer disposed between the first and second internal electrodes; wherein
    a plurality of the first internal electrodes are connected to each other, and a plurality of the second internal electrodes are connected to each other, via through holes that penetrate the piezoelectric layer in a laminated direction of the first internal electrode and the second internal electrode;
    the first internal electrode is formed so that an entire periphery portion of the first internal electrode is exposed on a side face of the multilayer piezoelectric element;
    the second internal electrode is formed so that an entire periphery portion of the second internal electrode is positioned inside the side face of the multilayer piezoelectric element; and
    a spacer layer is disposed between the entire periphery portion of the second internal electrode and the side face of the multilayer piezoelectric element, the spacer layer being electrically isolated from the second internal electrode.

5. A multilayer piezoelectric element according to claim 4, wherein the spacer layer is formed of a material having a thermal shrinkage ratio in a burning process that is closer to a thermal shrinkage ratio of the second internal electrode than is a thermal shrinkage ratio of the piezoelectric layer.

6. A multilayer piezoelectric element according to claim 4, wherein the spacer layer is formed of the same material as the second internal electrode.

7. A multilayer piezoelectric element according to claim 4, wherein the spacer layer has a same thickness as the second internal electrode.

8. A multilayer piezoelectric element according to claim 4, wherein each of the second internal electrodes comprises a plurality of individual electrodes that are disposed in a matrix.

9. A multilayer piezoelectric element according to claim 4, further comprising a terminal electrode positioned on an outermost face of the multilayer piezoelectric element in the laminated direction; wherein
    a drive power is supplied through the terminal electrode.

10. A multilayer piezoelectric element comprising:
    a first internal electrode and a second internal electrode, the first internal electrode and the second internal electrode being laminated alternately; and
    a piezoelectric layer disposed between the first and second internal electrodes; wherein
    a plurality of the first internal electrodes are connected to each other, and a plurality of the second internal electrodes are connected to each other, via through holes that penetrate the piezoelectric layer in a laminated direction of the first internal electrode and the second internal electrode; and
    the first internal electrode and the second internal electrode are formed so that entire periphery portions of the first internal electrode and of the second internal electrode are positioned inside a side face of the multilayer piezoelectric element; and further comprising:
    a first spacer layer that is disposed between the entire periphery portion of the first internal electrode and the side face of the multilayer piezoelectric element, the first spacer layer being electrically isolated from the first internal electrode; and
    a second spacer layer that is disposed between the entire periphery portion of the second internal electrode and the side face of the multilayer piezoelectric element, the second spacer layer being electrically isolated from the second internal electrode.

11. A multilayer piezoelectric element according to claim 10, wherein the first spacer layer is formed of a material having a thermal shrinkage ratio in a burning process that is closer to a thermal shrinkage ratio of the first internal electrode than is a thermal shrinkage ratio of the piezoelectric layer; and
    the second spacer layer is formed of a material having a thermal shrinkage ratio in the burning process that is closer to a thermal shrinkage ratio of the second internal electrode than is a thermal shrinkage ratio of the piezoelectric layer.

12. A multilayer piezoelectric element according to claim 10, wherein the first spacer layer is formed of the same material as the first internal electrode; and the second spacer layer is formed of the same material as the second internal electrode.

13. A multilayer piezoelectric element according to claim 10, wherein the first spacer layer has a same thickness as the first internal electrode, and the second spacer layer has a same thickness as the second internal electrode.

14. A multilayer piezoelectric element according to claim 10, wherein each of the second internal electrodes comprises a plurality of individual electrodes that are disposed in a matrix.

15. A multilayer piezoelectric element according to claim 10, further comprising a terminal electrode positioned on an outermost face of the multilayer piezoelectric element in the laminated direction; wherein a drive power is supplied through the terminal electrode.

16. A multilayer piezoelectric element comprising:

a first internal electrode and a second internal electrode, the first internal electrode and the second internal electrode being laminated alternately;

a piezoelectric layer disposed between the first and second internal electrodes; and a conductive part that is disposed on a side face of the multilayer piezoelectric element so that the conductive part is in contact with the first internal electrode, wherein the first internal electrode is formed so that an entire periphery portion of the first internal electrode is exposed on a side face of the multilayer piezoelectric element;

the second internal electrode is formed so that an entire periphery portion of the second internal electrode is positioned inside a side face of the multilayer piezoelectric element; and a plurality of the second internal electrodes are connected to each other via a through hole that penetrates the piezoelectric layer in a laminated direction of the first internal electrode and the second internal electrode.

17. A multilayer piezoelectric element according to claim 16, wherein each of the second internal electrodes comprises a plurality of individual electrodes that are disposed in a matrix.

18. A multilayer piezoelectric element according to claim 16, further comprising a terminal electrode positioned on an outermost face of the multilayer piezoelectric element in the laminated direction; wherein a drive power is supplied through the terminal electrode.

* * * * *